(12) United States Patent
Yoon

(10) Patent No.: US 10,276,834 B2
(45) Date of Patent: Apr. 30, 2019

(54) ORGANIC LIGHT-EMITTING DEVICE

(71) Applicant: Corning Precision Materials Co., Ltd., Chungcheongnam-do (KR)

(72) Inventor: Hong Yoon, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/900,464

(22) Filed: Feb. 20, 2018

(65) Prior Publication Data

US 2018/0175328 A1 Jun. 21, 2018

Related U.S. Application Data

(62) Division of application No. 14/319,172, filed on Jun. 30, 2014.

(30) Foreign Application Priority Data

Jun. 28, 2013 (KR) .................. 10-2013-0075473

(51) Int. Cl.
*H01L 51/52* (2006.01)

(52) U.S. Cl.
CPC ...... *H01L 51/5275* (2013.01); *H01L 51/5206* (2013.01); *H01L 2251/5369* (2013.01); *H01L 2251/55* (2013.01)

(58) Field of Classification Search
None
See application file for complete search history.

(56) References Cited

U.S. PATENT DOCUMENTS

| 6,316,786 | B1 | 11/2001 | Mueller et al. |
| 8,314,542 | B2 | 11/2012 | Lee et al. |
| 2007/0141753 | A1 | 6/2007 | Uemura et al. |
| 2007/0176191 | A1 | 8/2007 | Im |
| 2007/0194708 | A1 | 8/2007 | Van Mol et al. |
| 2009/0072733 | A1 | 3/2009 | Funayama et al. |
| 2010/0327296 | A1 | 12/2010 | Iwase et al. |
| 2011/0297948 | A1 | 12/2011 | Jeong et al. |
| 2012/0049723 | A1 | 3/2012 | Lee et al. |
| 2012/0292610 | A1 | 11/2012 | Wang et al. |
| 2014/0206117 | A1 | 7/2014 | Sonoda et al. |

(Continued)

FOREIGN PATENT DOCUMENTS

KR 20070079249 A 8/2007
KR 20110062236 A 6/2011

*Primary Examiner* — Telly D Green
(74) *Attorney, Agent, or Firm* — Lerner, David, Littenberg, Krumholz & Mentlik, LLP

(57) ABSTRACT

An organic light-emitting device (OLED) which exhibits superior light extraction efficiency due to an extraction structure for dipole light generated from an organic light-emitting layer. The OLED includes a first glass substrate, a first electrode disposed on the first glass substrate, an organic light-emitting layer disposed on the first electrode, a second electrode disposed on the organic light-emitting layer, and a second glass substrate disposed on the second electrode. The second electrode has a composite electrode structure including a first transparent electrode layer and a second transparent electrode layer stacked on each other, the refractive index of the second transparent electrode layer being higher than the refractive index of the first transparent electrode layer.

6 Claims, 3 Drawing Sheets

(56) References Cited

U.S. PATENT DOCUMENTS

2014/0312327 A1    10/2014    Bhandari et al.
2014/0312339 A1*   10/2014    Fujita .................... H01L 27/322
                                                                                                           257/40
2017/0301882 A1    10/2017    Iwase et al.

* cited by examiner (a)            (b)

ORGANIC LIGHT-EMITTING DEVICE

CROSS REFERENCE TO RELATED APPLICATION

The present application is a divisional of U.S. patent application Ser. No. 14/319,172, filed Jun. 30, 2014, which claims priority from Korean Patent Application Number 10-2013-0075473 filed on Jun. 28, 2013, the entire contents of which are incorporated herein by reference.

BACKGROUND OF THE INVENTION

Field of the Invention

The present invention relates to an organic light-emitting device (OLED), and more particularly, to an OLED which exhibits superior light extraction efficiency using an extraction structure for dipole light (light from dipole source) generated from an organic light-emitting layer.

Description of Related Art

In general, only about 20% of light generated from an OLED is emitted to the outside and about 80% of the light is lost by a waveguide effect originating from the difference in the refractive index between a glass substrate and an organic light-emitting layer which includes an anode, a hole injection layer, a hole transport layer, a light-emitting layer, an electron transport layer and an electron injection layer and by a total internal reflection originating from the difference in the refractive index between the glass substrate and the air. Specifically, the refractive index of the internal organic light-emitting layer 30 ranges from 1.7 to 1.8, whereas the refractive index of indium tin oxide (ITO) which is generally used for the anode is about 1.9. Since the two layers have a very small thickness ranging from 200 to 400 nm and the refractive index of glass used for the glass substrate is about 1.5, a planar waveguide is thereby formed inside the OLED. It is calculated that the ratio of the light lost in the internal waveguide mode due to the above-described reason is about 45%. In addition, since the refractive index of the glass substrate is about 1.5 and the refractive index of the ambient air is 1.0, when the light is directed outward from the inside of the glass substrate, a ray of light having an angle of incidence greater than a critical angle is totally reflected and is trapped inside the glass substrate. Since the ratio of the trapped light is up to about 35%, only about 20% of the generated light is emitted to the outside.

Dipoles are a type of light generated from the OLED, and the light extraction efficiency is significantly dependent on the direction in which dipoles oscillate. In general, dipoles oscillate in the direction vertical or parallel to a plane of the organic light-emitting layer. Dipoles oscillating in the vertical direction and dipoles oscillating in the parallel direction are uniformly distributed.

Among them, dipoles oscillating in the vertical direction have a significant contribution to the formation of the internal waveguide mode. That is, dipoles oscillating in the vertical direction are a cause that lowers the light extraction efficiency of the OLED.

In such an atmosphere where dipoles oscillating in the vertical direction continuously to exist, a significant improvement in the light extraction efficiency is not expectable even if, for example, a nanostructural internal light extraction layer having a light-scattering function is sandwiched between the anode and the glass substrate.

The information disclosed in the Background of the Invention section is provided only for better understanding of the background of the invention, and should not be taken as an acknowledgment or any form of suggestion that this information forms a prior art that would already be known to a person skilled in the art.

RELATED ART DOCUMENT

Patent Document 1: Korean Patent No. 10-2011-0062236 (Jun. 10, 2011)

BRIEF SUMMARY OF THE INVENTION

Various aspects of the present invention provide a an organic light-emitting device (OLED) which exhibits superior light extraction efficiency due to an extraction structure for dipole light (light from dipole source) generated from an organic light-emitting layer.

In an aspect of the present invention, provided is an OLED that includes: a first glass substrate; a first electrode disposed on the first glass substrate; an organic light-emitting layer disposed on the first electrode; a second electrode disposed on the organic light-emitting layer; and a second glass substrate disposed on the second electrode. The second electrode has a composite electrode structure including a first transparent electrode layer and a second transparent electrode layer stacked on each other, the refractive index of the second transparent electrode layer being higher than the refractive index of the first transparent electrode layer.

According to an embodiment of the present invention, the first transparent electrode layer may be disposed at a side of the second glass substrate, and the second transparent electrode layer may be disposed at a side of the organic light-emitting layer.

The refractive index of the second transparent electrode layer may range from 2.1 to 2.5.

The second transparent electrode layer may be made of Al- or Ga-doped ZnO or Nb-doped $TiO_2$.

The first transparent electrode layer may be made of indium tin oxide (ITO).

The thickness of the second electrode may range from 50 to 200 nm.

In another aspect of the present invention, provided is an OLED that includes: a first glass substrate; a first electrode disposed on the first glass substrate; an organic light-emitting layer disposed on the first electrode; a second electrode disposed on the organic light-emitting layer, wherein the second electrode has a composite electrode structure including a first transparent electrode layer and a second transparent electrode layer stacked on each other, the refractive index of the second transparent electrode layer being higher than a refractive index of the first transparent electrode layer; a light extraction layer disposed on the second electrode; and a second glass substrate disposed on the light extraction layer.

According to an embodiment of the present invention, the light extraction layer may include: a matrix layer; and at least one light-scattering body disposed inside the matrix layer, the light-scattering body being made of a material, the refractive index of which is higher than the refractive index of the matrix layer.

The refractive index of the light-scattering body may be higher than the refractive index of the first transparent electrode layer.

The first transparent electrode layer may be disposed at a side of the light extraction layer, and the second transparent electrode layer may be disposed at a side of the organic light-emitting layer.

The light-scattering body may be disposed inside a portion of the matrix layer that adjoins to the first transparent electrode layer.

The refractive index of the second transparent electrode layer may range from 2.1 to 2.5.

The second transparent electrode layer may be made of Al- or Ga-doped ZnO or Nb-doped $TiO_2$.

The first transparent electrode layer may be made of ITO.

The thickness of the second electrode may range from 50 to 200 nm.

The above-described OLED may have a tandem structure in which a plurality of the organic light-emitting layers are provided which each alternate with interconnecting layers.

According to embodiments of the invention, the OLED has the extraction structure for dipole light generated from the organic light-emitting layer. The extraction structure for dipole light includes the high refractive index layer, the low refractive index layer and the high refractive index light-scattering bodies. The extraction structure for dipole light can first guide the combination of light in the direction in which the light exits and then diversify paths along which the light is emitted by scattering the light, thereby improving the light extraction efficiency of the OLED. In particular, the extraction structure for dipole light can convert vertical dipole light generated by dipoles that oscillate in a direction vertical to the device into parallel dipole light. Considering that the vertical dipole light is a cause that creates total reflection by forming a waveguide mode inside the OLED, converting the vertical dipole light into the parallel dipole light can realize superior light extraction efficiency.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
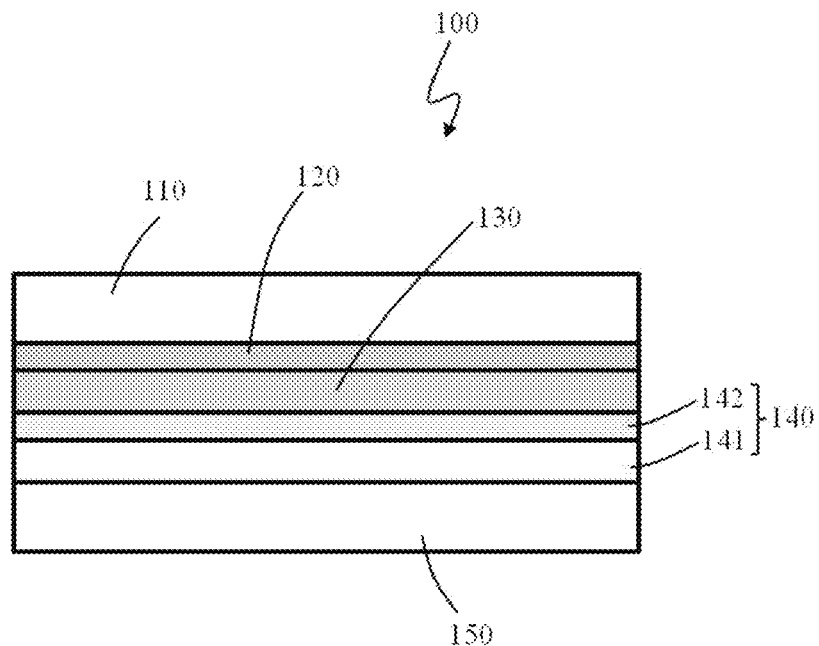
FIG. 1 is a cross-sectional view schematically showing an organic light-emitting device (OLED) according to an exemplary embodiment of the invention.

Reference will now be made in detail to an organic light-emitting device (OLED) according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, an OLED 100 according to an exemplary embodiment of the invention includes a first glass substrate 110, a first electrode 120, an organic light-emitting layer 130, a second electrode 140 and a second glass substrate 150. For the operation of the OLED 100, a thin-film transistor (not shown) is connected to the OLED 100.

The first glass substrate 110 is an encapsulation substrate which protects the first electrode 120, the organic light-emitting layer 130 and the second electrode 140 from the external environment. The first glass substrate 110 serves also as a base substrate on which the first electrode 120, the organic light-emitting layer 130 and the second electrode 140 are deposited. The first glass substrate 110 can be made of, for example, soda-lime ($SiO_2$—CaO—$Na_2O$) glass or aluminosilicate ($SiO_2$—$Al_2O_3$—$Na_2O$) glass. In addition, the first glass substrate 110 and the second glass substrate 150 are disposed such that they face each other.

The first electrode 120 is formed on the first glass substrate 110. The first electrode 120 serves as the cathode of the OLED 100. As shown in FIG. 1, when the OLED 100 according to this exemplary embodiment is a bottom emission type OLED, the first electrode 120 can be implemented as a metal thin film made of Al, Al:Li or Mg:Ag having a smaller work function in order to facilitate electron injection into the organic light-emitting layer 130. Although not shown, when the OLED according to this exemplary embodiment is a top emission type OLED, the first electrode can have a multilayer structure which includes a semitransparent electrode of a metal thin film made of Al, Al:Li or Mg:Ag and a transparent electrode of an oxide thin film made of indium tin oxide (ITO) in order to facilitate the transmission of light that is generated from the organic light-emitting layer 130.

The organic light-emitting layer 130 includes an electron injection layer, an electron transport layer, an emissive layer, a hole transport layer and a hole injection layer which are sequentially stacked on the first electrode 120. With this structure of the organic light-emitting layer 130, when a forward voltage is applied between the second electrode 140 serving as the anode and the first electrode 120 serving as the cathode, electrons from the first electrode 120 migrate to the emissive layer through the electron injection layer and the electron transport layer, while holes from the second electrode 140 migrate to the emissive layer through the hole injection layer and the hole transport layer. The electrons and the holes that have migrated into the emissive layer recombine, thereby generating parallel dipoles that oscillate in the direction parallel to the plane of the emissive layer and vertical dipoles that oscillate in the direction vertical to the plane of the emissive layer. When the parallel dipoles and the vertical dipoles transit from an excited state to a ground state, parallel dipole light and vertical dipole light are emitted. The brightness of the parallel dipole light and the vertical dipole light is proportional to the amount of current that flows between the first and second electrodes 120 and 140.

The OLED 100 according to this exemplary embodiment can have a tandem structure, in which a plurality of the organic light-emitting layers 130 are provided which each alternate with interconnecting layers.

The second electrode 140 is disposed on the organic light-emitting layer 130. The second electrode 140 serves as the anode of the OLED 100. The second electrode 140 according to this exemplary embodiment has a composite electrode structure in which a first transparent electrode layer 141 and a second transparent electrode layer 142 are stacked on each other. According to an embodiment of the invention, the thickness of the second electrode 140 having the composite electrode structure can range from 50 to 200 nm.

The first transparent electrode layer 141 is disposed at the side of the second glass substrate 150, and the second transparent electrode layer 142 is disposed at the side of the organic light-emitting layer 130. The second transparent electrode layer 142 is made of a material, the refractive index of which is higher than that of the first transparent electrode layer 141. Thus, the portion of the second electrode 140 that adjoins to the organic light-emitting layer 130 has a higher refractive index, whereas the portion of the second electrode 140 that adjoins to the glass substrate 150 has a lower refractive index. In this manner, the second electrode 140 has the composite electrode structure in which the upper and lower portions (with respect to the paper surface) have different refractive indices.

The second transparent electrode layer 142, i.e. the portion of the second electrode 140 that adjoins to the organic light-emitting layer 130, serves to guide parallel dipole light and vertical dipole light generated from the organic light-emitting layer 130 to the first transparent electrode layer 141 having a lower refractive index so as to be optically coupled. That is, the second transparent electrode layer 142 serves to guide optical coupling in the direction toward the second glass substrate 150 that is on the outermost path of light emitted from the organic light-emitting layer 130. When the optical coupling between the parallel dipole light and the vertical dipole light is guided in the direction toward the second glass substrate 150 in this manner, the amount of exiting light increases.

According to an embodiment of the invention, the refractive index (n) of the second transparent electrode layer 142 may range from 2.1 to 2.5. In order to have this refractive index, the second transparent electrode layer 142 can be made of Al- or Ga-doped ZnO or Nb-doped $TiO_2$. However, this is merely an example, and the second transparent electrode layer 142 can be made of a variety of transparent conductive material, the refractive index of which is in the above-mentioned range.

According to an embodiment of the invention, the first transparent electrode layer 141 is made of a material, the refractive index of which is lower than that of the second transparent electrode layer 142, in order to guide optical coupling. According to an embodiment of the invention, since the refractive index of the second transparent electrode layer 142 ranges from 2.1 to 2.5, the first transparent electrode layer 141 can be made of a transparent conductive material, such as ITO, which has a lower refractive index.

The second glass substrate 150 is disposed on the second electrode 140. Like the first glass substrate 110, the second glass substrate 150 serves to protect the organic light-emitting layer 130 from the external environment. In addition, the second glass substrate 150 serves as a path through which light generated from the organic light-emitting layer 130 is emitted to the outside. The second glass substrate 150 can be made of, for example, soda-lime glass or alumino-silicate glass like the first glass substrate 110 which faces the second glass substrate 150.

Reference will now be made to an OLED according to another exemplary embodiment in conjunction with FIG. 2.

Figure 2:
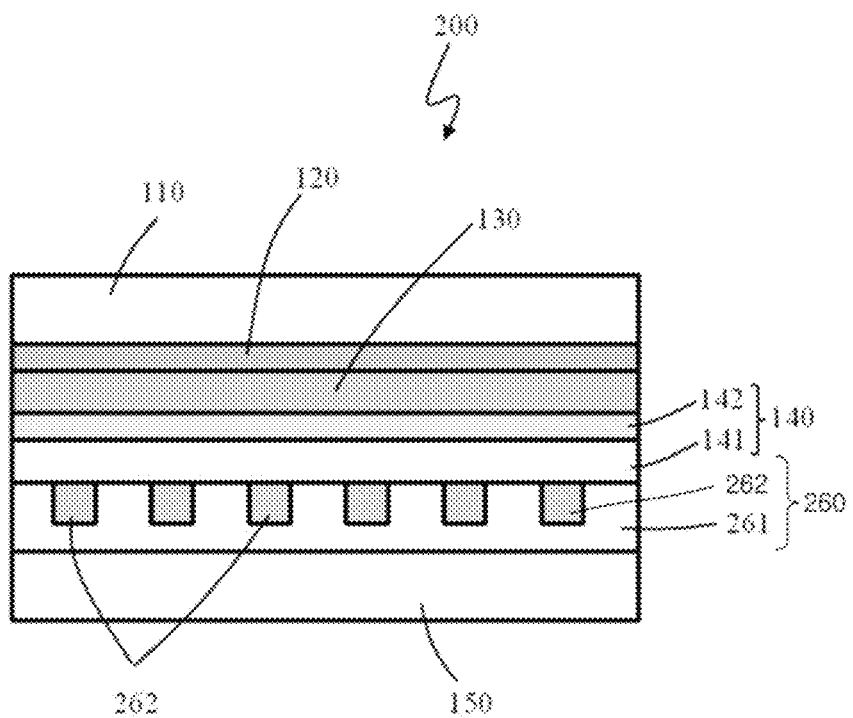
FIG. 2 is a cross-sectional view schematically showing an OLED according to another exemplary embodiment of the invention.

FIG. 2 is a cross-sectional view schematically showing the OLED according to another exemplary embodiment of the invention.

As shown in FIG. 2, an OLED 200 according to another exemplary embodiment of the invention includes a first glass substrate 110, a first electrode 120, an organic light-emitting layer 130, a second electrode 140, a second glass substrate 150 and a light extraction layer 260.

This exemplary embodiment of the invention is substantially the same as the former exemplary embodiment except that the light extraction layer is further included. Therefore, the same reference numerals will be used to designate the same elements, and detailed descriptions thereof will be omitted.

The light extraction layer 260 according to this exemplary embodiment is disposed between the second electrode 140 and the second glass substrate 150. The light extraction layer 260 serves as an internal light extraction layer of the OLED 200.

According to this exemplary embodiment, the light extraction layer 260 includes a matrix layer 261 and light-scattering bodies 262. The light-scattering bodies 262 are disposed inside the matrix layer 261. The light-scattering bodies 262 can have the shape of spheres or rods. The light-scattering bodies 262 can be configured as a plurality of light-scattering bodies which is arranged inside the matrix layer 261, more particularly, inside the portion of the matrix layer 261 that adjoins to the first transparent electrode layer 141.

Figure 3:
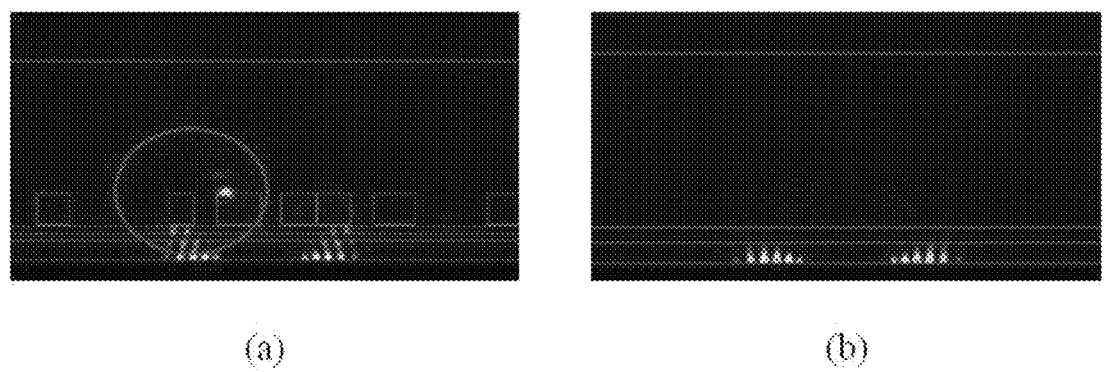
FIG. 3 is images showing simulation results on the geometry of propagation of vertical dipole light generated from an OLED according to an exemplary embodiment of the invention and that of vertical dipole light generated an OLED of the related art.

The light-scattering bodies 262 according to this exemplary embodiment are made of a material, the refractive index of which is higher than that of the matrix layer 216. In addition, the refractive index of the light-scattering bodies 262 is also higher than that of the first transparent electrode layer 141. Furthermore, the refractive index of the light-scattering bodies 262 can be the same as or similar to that of the second transparent electrode layer 142. Accordingly, the OLED 200 according to this exemplary embodiment has a light extraction structure including the second transparent electrode layer 142, the first transparent electrode layer 141 and the light extraction layer 260 (262), i.e. the high refractive index layer, the low refractive index layer and the high refractive index light-scattering bodies, which are sequentially disposed along the path along which parallel dipole light and vertical dipole light generated from the organic light-emitting layer 130 are emitted. Referring to the simulation results shown in FIG. 3, the parallel dipole light and the vertical dipole light generated from the organic light-emitting layer 130 are first guided to the first transparent electrode layer 141 having a lower refractive index by the second transparent electrode layer 142 having a higher refractive index so as to be optically coupled, and then scattered by the light-scattering bodies 262 having a higher refractive index. At this time, the vertical dipole light is converted into the parallel dipole light. When the vertical dipole light that has a significant contribution to the formation of a waveguide mode inside the OLED 200 that causes total reflection is converted into the parallel dipole light, the waveguide mode inside the OLED 200 is disturbed, leading to an improved light extraction efficiency (see part (a) in FIG. 3). In contrast, most of light generated from the OLED of the related art is trapped inside the organic light-emitting layer (see part (b) in FIG. 3).

Accordingly, the OLED 200 according to this exemplary embodiment has the light extraction structure which includes the high refractive index layer, the low refractive index layer and the high refractive index light-scattering bodies, and thus can realize a better light extraction efficiency than the OLED 100 according to the former exemplary embodiment having the light extraction structure which includes the high refractive index layer and the low refractive index layer.

Figure 4:
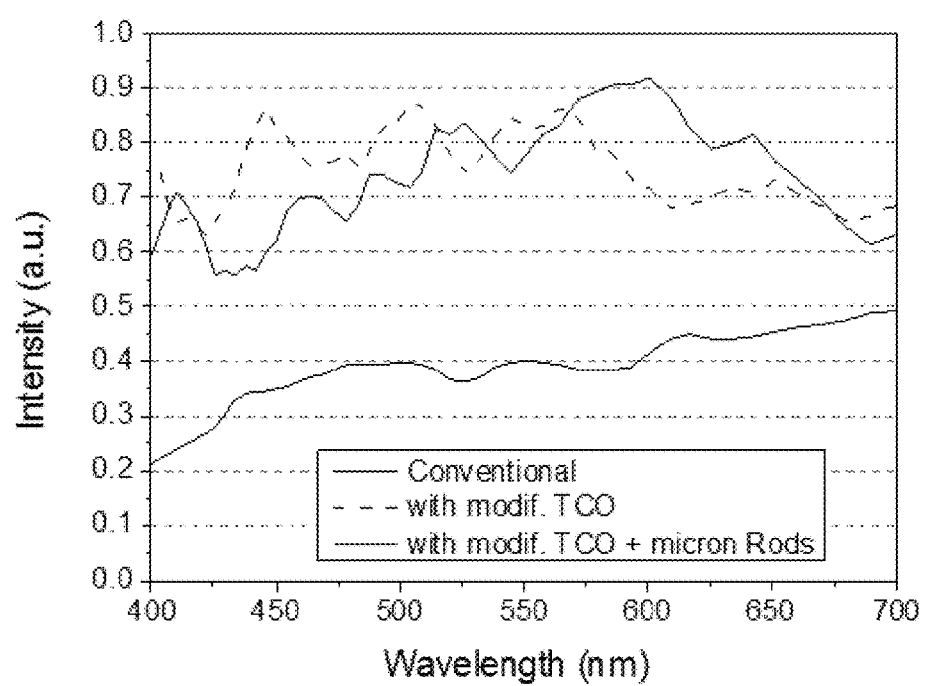
FIG. 4 is a graph showing the intensities of parallel dipole light depending on the wavelengths in an OLED according to an exemplary embodiment of the invention and an OLED of the related art.
Figure 5:
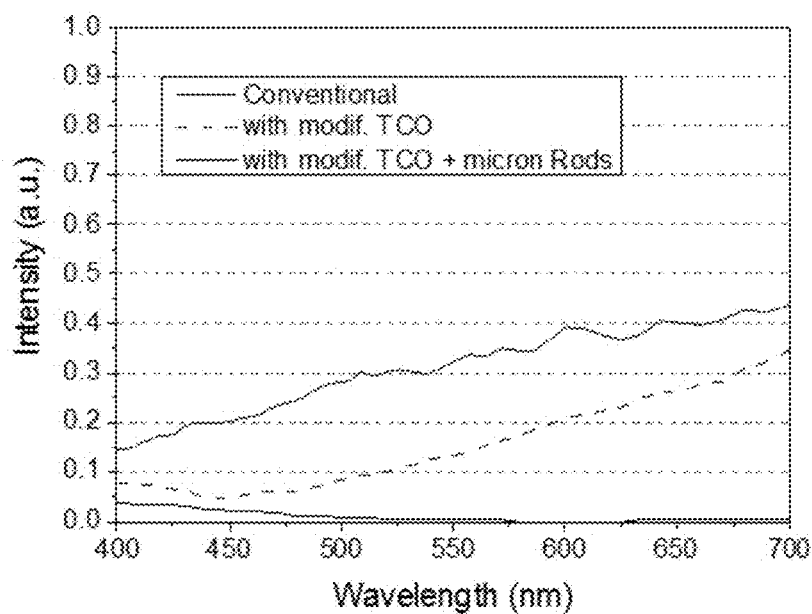
FIG. 5 is a graph showing the intensities of vertical dipole light depending on the wavelengths in an OLED according to an exemplary embodiment of the invention and an OLED of the related art.
Figure 6:
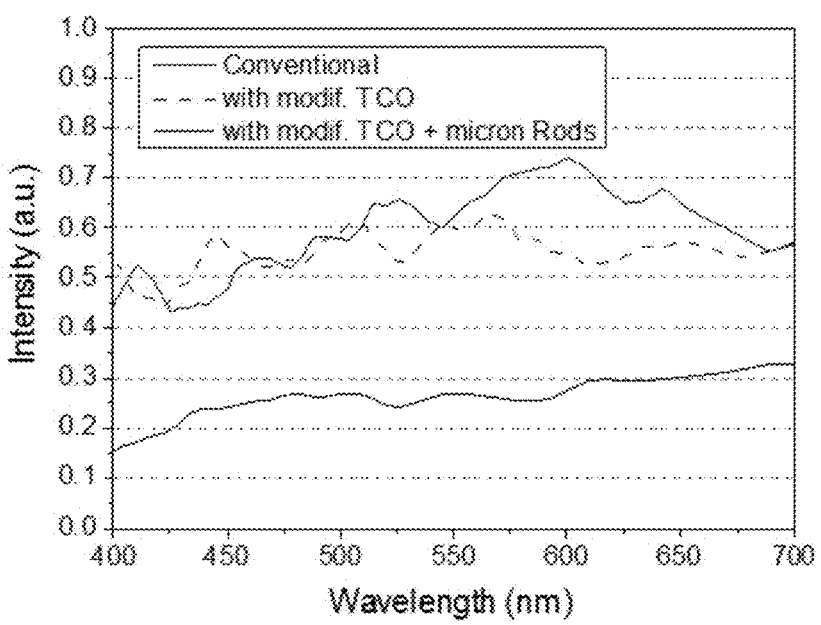
FIG. 6 is a graph showing the average values of the intensities of the parallel dipole light and the vertical dipole light depending on the wavelengths in the OLEDs shown in FIG. 4 and FIG. 5.

FIG. 4 and FIG. 5 are graphs showing the intensities of parallel dipole light and vertical dipole light depending on the wavelengths in an OLED according to an exemplary embodiment of the invention and an OLED of the related art. FIG. 6 is a graph showing the average values of the intensities of the parallel dipole light and the vertical dipole light depending on the wavelengths in the OLEDs shown in FIG. 4 and FIG. 5. According to these graphs, both the OLED according to an exemplary embodiment of the invention (with modif. TCO) and the OLED according to another exemplary embodiment of the invention (with modif. TCO+ micron rods) exhibit an improvement in the light intensity, i.e. the light extraction efficiency, over that of the OLED of the related art (conventional). In addition, it was also confirmed that the OLED according to another exemplary embodiment of the invention (with modif. TCO+micron rods) having the light extraction structure which includes the high refractive index layer, the low refractive index layer and the high refractive index light-scattering bodies can more efficiently extract vertical dipole light than the OLED according to an exemplary embodiment of the invention (with modif. TCO).

The foregoing descriptions of specific exemplary embodiments of the present invention have been presented with respect to the drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. An organic light-emitting device comprising:
   a first glass substrate;
   a first electrode disposed on the first glass substrate;
   an organic light-emitting layer disposed on the first electrode;
   a second electrode disposed on the organic light-emitting layer, wherein the second electrode has a composite electrode structure including a first transparent electrode layer and a second transparent electrode layer stacked on each other, a refractive index of the second transparent electrode layer being higher than a refractive index of the first transparent electrode layer;
   a light extraction layer disposed on the second electrode, the light extraction layer including a matrix layer and at least on least one light-scattering body disposed inside a portion of the matrix layer, wherein the portion of the matrix layer directly adjoins the first transparent electrode layer and is away from the second glass substrate, the light-scattering body being made of a material having a refractive index which is higher than a refractive index of the matrix layer, the refractive index of the light-scattering body being higher than the refractive index of the first transparent electrode layer, and
   a second glass substrate disposed on the light extraction layer,
   wherein the first transparent electrode layer is disposed at a side of the light extraction layer, and the second transparent electrode layer is disposed at a side of the organic light-emitting layer.

2. The organic light-emitting device according to claim 1, wherein the refractive index of the second transparent electrode layer ranges from 2.1 to 2.5.

3. The organic light-emitting device according to claim 2, the second transparent electrode layer comprises Al- or Ga-doped ZnO or Nb-doped $TiO_2$.

4. The organic light-emitting device according to claim 3, wherein the first transparent electrode layer comprises indium tin oxide.

5. The organic light-emitting device according to claim 1, wherein a thickness of the second electrode ranges from 50 to 200 nm.

6. The organic light-emitting device according to claim 1, comprising a plurality of the organic light-emitting layers which each alternate with interconnecting layers to form a tandem structure.

* * * * *